US007673225B2

(12) United States Patent
Jeong et al.

(10) Patent No.: US 7,673,225 B2
(45) Date of Patent: Mar. 2, 2010

(54) APPARATUS AND METHOD FOR TRANSMITTING/RECEIVING DATA IN A COMMUNICATION SYSTEM USING STRUCTURED LOW DENSITY PARITY CHECK CODE

(75) Inventors: Hong-Sil Jeong, Seoul (KR);
Chan-Byoung Chae, Seoul (KR);
Dong-Seek Park, Yongin-si (KR);
Jae-Yoel Kim, Suwon-si (KR);
Young-Kyun Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 905 days.

(21) Appl. No.: 11/471,795

(22) Filed: Jun. 21, 2006

(65) Prior Publication Data
US 2007/0011570 A1 Jan. 11, 2007

(30) Foreign Application Priority Data
Jun. 21, 2005 (KR) .................. 10-2005-0053743

(51) Int. Cl.
*G06F 11/00* (2006.01)
(52) U.S. Cl. ...................................... 714/800
(58) Field of Classification Search .......... 714/800–801
See application file for complete search history.

(56) References Cited

U.S. PATENT DOCUMENTS
2005/0166131 A1* 7/2005 Xia et al. .................... 714/800

FOREIGN PATENT DOCUMENTS
EP 1 524 792 4/2005
JP 2004-527964 9/2004
JP 2005-513953 5/2005
WO WO 02/091594 11/2002
WO WO 03/056742 7/2003
WO WO 2005/020500 3/2005
WO WO 2005/036774 4/2005

OTHER PUBLICATIONS

Dore et al., A tructured LDPC code construction for efficient encoder design, 2006, IEEE, p. 1680-1685.*
Rovini et al. VLSI design of a high-throughput multi-rate decoder for structured LDPC codes, 2005, IEEE, p. 1 to 8.*
Tanner et al., A class of group-structured LDPC codes, 2001, pro. of. ISTA, citeseer.com, p. 1 to 5.*
Jin Lu et al., "A Class of Structured LDPC Codes With Large Girth", IEEE Communications Society, p. 425-429, Jun. 2004.
Yusuke Akie et al., "A Consideration on the Construction of LDPC Coded MIMO Spatially Multiplexed Communication Schemes", Department of Computer Science and Engineering, Graduate School of Engineering, p. 31-36, Feb. 23, 2005.

(Continued)

*Primary Examiner*—Shelly A Chase
(74) *Attorney, Agent, or Firm*—The Farrell Law Firm, LLP

(57) ABSTRACT

Provided is an apparatus and method for transmitting/receiving data in a communication system using a structured Low Density Parity Check (LDPC) code. The transmitter performs structured LDPC coding on input information data using a structured LDPC code, parallel-converts a structured LDPC codeword generated by performing the structured LDPC coding, in units of groups having a predetermined size, and transmits data. The receiver receives a plurality of parallel data streams, serial-converts the received parallel data streams in units of groups having a predetermined size, and performs structured LDPC decoding on the data which was serial-converted group by group, using a structured LDPC code.

34 Claims, 12 Drawing Sheets

OTHER PUBLICATIONS

Vijay Nagarajan et al., "Structured LDPC Over URN Model Channels With Memory", Electrical and Computer Engineering Department, May 2004.

Nguyen Le Khoa et al., "A Study on LDPC Coded MIMO-OFDM Systems", Nagoya Institute of Technology, Mar. 7, 2005.

Jianming Wu et al., Best Mapping For LDPC Coded Modulation on SISO, MIMO, and MAC Channels, IEEE Communications Society, 2004.

Ka Leong Lo et al., Layered Space-Time Structure with Low-Density Parity-Check and Convolutional Codes as Constituent Codes, European Transactions on Telecommunications, 2005.

Minseok Noh et al., A Variable Rate LDPC Coded V-BLAST System, 2004.

M.J. Syed et al., LDPC-based Space-time Coded OFDM Systems with Channel Estimation, IEE Proc.—Commun., 2004.

* cited by examiner $$H = \begin{bmatrix} 1 & 0 & 1 & 0 & 1 & 0 & 1 & 0 \\ 1 & 0 & 0 & 1 & 0 & 1 & 0 & 1 \\ 0 & 1 & 1 & 0 & 0 & 1 & 1 & 0 \\ 0 & 1 & 0 & 1 & 1 & 0 & 0 & 1 \end{bmatrix}$$

| $P^a_{11}$ | $P^a_{12}$ | $P^a_{13}$ | $P^a_{14}$ | ... | $P^a_{1(q-1)}$ | $P^a_{1q}$ |
|---|---|---|---|---|---|---|
| $P^a_{21}$ | $P^a_{22}$ | $P^a_{23}$ | $P^a_{24}$ | ... | $P^a_{2(q-1)}$ | $P^a_{2q}$ |
| $P^a_{31}$ | $P^a_{32}$ | $P^a_{33}$ | $P^a_{34}$ | ... | $P^a_{3(q-1)}$ | $P^a_{3q}$ |
| ⋮ | ⋮ | ⋮ | ⋮ | ... | ⋮ | ⋮ |
| $P^a_{p1}$ | $P^a_{p2}$ | $P^a_{p3}$ | $P^a_{p4}$ | ... | $P^a_{p(q-1)}$ | $P^a_{pq}$ |

FIG.5
(PRIOR ART)

$$P = \begin{bmatrix} 0 & 1 & 0 & & 0 \\ 0 & 0 & 1 & \cdots & 0 \\ \vdots & \vdots & \vdots & & \vdots \\ 0 & 0 & 0 & \cdots & 1 \\ 1 & 0 & 0 & & 0 \end{bmatrix}$$

FIG.6
(PRIOR ART)

APPARATUS AND METHOD FOR TRANSMITTING/RECEIVING DATA IN A COMMUNICATION SYSTEM USING STRUCTURED LOW DENSITY PARITY CHECK CODE

PRIORITY

This application claims the benefit under 35 U.S.C. § 119 (a) of an application entitled "Apparatus and Method for Transmitting/Receiving Data in a Communication System Using Structured Low Density Parity Check Code" filed in the Korean Intellectual Property Office on Jun. 21, 2005 and assigned Ser. No. 2005-53743, the entire contents of which are incorporated herein by reference.

BACKGROUND OF THE INVENTION

1. Field of the Invention

The present invention relates generally to an apparatus and method for transmitting/receiving data in a communication system, and in particular, to an apparatus and method for transmitting/receiving data in a multi-antenna communication system using structured Low Density Parity Check (LDPC) codes.

2. Description of the Related Art

Currently, due to the rapid development of communication technologies, communication systems are evolving into high-speed, high-capacity communication systems capable of processing and transmitting a variety of information such as images and radio data, transcending the conventional voice-oriented service. The evolution of high-speed, high-capacity communication systems extends not only to wire networks but also to wireless networks. As a result, there is a need for the development of a technology capable of transmitting high-capacity data, of which the capacity of the wireless network approaches the capacity of the wire network.

To meet the needs of the high-speed, high-capacity communication system, the communication system uses an appropriate channel coding scheme for data transmission/reception to increase the system transmission efficiency, contributing to the improvement of the system performance.

However, the mobile communication system, due to its characteristics, may inevitably suffer from errors caused by noise, interference and fading according to channel conditions during data transmission. Therefore, the mobile communication system suffers a loss of information data due to these errors. In order to reduce information data loss, the mobile communication system uses various error control schemes according to channel characteristics, thereby contributing to the improvement of the system reliability. Of the error control schemes, an error correction code-based error control scheme is most popularly used.

In the next generation mobile communication system, an increase in the number of users who desire to receive more data at higher speed requires an increase in the data rate. In order to meet the user's demands, active research is being conducted on a multi-antenna communication system using multiple transmission/reception antennas, i.e., a Multiple Input Multiple Output (MIMO) communication system.

With reference to the schematic diagram of FIG. 1, a description will now be made of a structure of a transmitter in a general MIMO communication system.

Referring to FIG. 1, the transmitter includes an encoder 110, a spatial mapper 120, and a signal mapping unit 130 connected to a plurality of antennas including a first transmission antenna TxANT#1 to an $M^{th}$ transmission antenna TxANT#M. The signal mapping unit 130 includes M signal mappers including a first signal mapper 130-1 to an $M^{th}$ signal mapper 130-M.

The encoder 110 encodes input information data into coded symbols according to a preset coding rate, and outputs the generated coded symbols to the spatial mapper 120.

The spatial mapper 120 spatially-maps serial coded symbols output from the encoder 110 into M parallel signals, where M is the number of antennas. The spatial mapper 120 outputs the parallel signals to their corresponding signal mappers 130-1 to 130-M, respectively. For example, the spatial mapper 120 sequentially parallel-converts the coded symbols output from the encoder 110 into M signals according to their output order, and outputs the M signals to the first signal mapper 130-1 to the $M^{th}$ signal mapper 130-M, respectively.

The signal mapping unit 130 signal-maps the parallel signals output from the spatial mapper 120 according to a signal mapping scheme preset in each of the signal mappers 130-1 to 130-M, and outputs the signal-mapped signals to their corresponding transmission antennas. That is, each of the first signal mapper 130-1 to the $M^{th}$ signal mapper 130-M signal-maps the signal output from the spatial mapper 120 according to a constellation preset therein, and outputs the resultant signal to its corresponding transmission antenna.

For example, each of the first signal mapper 130-1 to the $M^{th}$ signal mapper 130-M signal-maps its input signal using Binary Phase Shift Keying (BPSK) if the number n of bits of the input signal is 1 (n=1), and signal-maps its input signal using 8-ary Quadrature Amplitude Modulation (8 QAM) if the number n of bits of the input signal is 3 (n=3).

Assuming that the number of bits of information data input to the transmitter of FIG. 1 is denoted by k, a coding rate R of the transmitter is $$R = M \times \frac{k}{n},$$

where M denotes the number of transmission antennas.

With reference to the schematic diagram of FIG. 2, a description will now be made of a structure of a receiver in a general MIMO communication system.

Referring to FIG. 2, the receiver includes a detector 210 connected to a plurality of antennas including a first reception antenna RxAnt#1 to a $P^{th}$ reception antenna RxAnt#P, a spatial demapper 220, a decoder 230, and a spatial mapper 240.

The number of transmission antennas of the transmitter can be either equal to or different from the number of the reception antennas of the receiver. The receiver receives signals via P reception antennas including the first reception antenna RxAnt#1 to the $P^{th}$ reception antenna RxAnt#P. The signals received via the first reception antenna RxAnt#1 to the $P_{th}$ reception antenna RxAnt#P are input to the detector 210.

The detector 210 detects the signals received via the first reception antenna RxAnt#1 to the $P_{th}$ reception antenna RxAnt#P, and outputs the detected signals to the spatial demapper 220.

The spatial demapper 220 spatially-demaps the signal detected by the detector 210 according to a spatial demapping scheme corresponding to the spatial mapping scheme of the spatial mapper used in the transmitter, and outputs the resultant signal to the decoder 230.

The decoder 230 decodes the signal output from the spatial demapper 220 according to a decoding scheme corresponding to the coding scheme used in the transmitter. The signal output from the decoder 230 can be normally restored to the original data transmitted by the transmitter, when it has not suffered an error in the wireless channel environment. However, the output signal can be subject to iterative decoding for reliable decoding, when it has suffered an error in the wireless channel environment.

To perform the iterative decoding, the decoder 230 outputs the signal decoded with the decoding scheme corresponding to the coding scheme used in the transmitter, to the spatial mapper 240.

The spatial mapper 240 spatially-maps the signal output from the decoder 230 with a spatial mapping scheme corresponding to the spatial mapping scheme used in the transmitter, and outputs the resultant signal back to the detector 210 to thereby perform iterative decoding.

The iterative decoding contributes to an increase in restoration reliability of the information data. After decoding the received signal into a reliable signal through the iterative decoding, the decoder 230 outputs the decoded reliable signal as a final information data signal.

Typical error correction codes include turbo codes and LDPC codes. It is well known that the turbo code is superior in performance gain to a convolutional code conventionally used for error correction, during high-speed data transmission. The turbo code is advantageous in that it can efficiently correct an error caused by noises generated in a transmission channel, thereby increasing reliability of the data transmission. The LDPC code can be decoded using an iterative decoding algorithm based on a sum-product algorithm in a factor graph. Because a decoder for the LDPC code uses the sum-product algorithm-based iterative decoding algorithm, it is lower in complexity than a decoder for the turbo code. In addition, the decoder for the LDPC code is easy to implement with a parallel processing decoder, compared with the decoder for the turbo code.

Shannon's channel coding theorem shows that reliable communication is possible only at a data rate not exceeding a channel capacity. However, Shannon's channel coding theorem has proposed no detailed channel coding/decoding method for supporting a data rate up to the channel capacity limit. Although a random code having a very large block size shows performance approximating the channel capacity limit of Shannon's channel coding theorem, it is actually impossible to implement a Maximum A Posteriori (MAP) or Maximum Likelihood (ML) decoding method because of its heavy calculation load.

The turbo code was proposed by Berrou, Glavieux and Thitimajshima in 1993, and has superior performance approximating the channel capacity limit of Shannon's channel coding theorem. The proposal of the turbo code triggered a research on iterative decoding and graphical expression of codes, and LDPC codes proposed by Gallager in 1962 have been newly spotlighted in the research. Cycles exist in a factor graph of the turbo code and the LDPC code, and it is well known that iterative decoding in the factor graph of the LDPC code where cycles exist is suboptimal. Also, it has been experimentally proven that the LDPC code has excellent performance through iterative decoding. The LDPC code known to have the highest performance shows performance having a difference of only about 0.04 [dB] at the channel capacity limit of Shannon's channel coding theorem at a bit error rate (BER) of $10^{-5}$, using a block size of $10^7$. In addition, although an LDPC code defined in Galois field (GF) with q>2, i.e., GF(q), increases in complexity in its decoding process, it is much superior in performance to a binary code. However, there has been provided no satisfactory theoretical description of successful decoding by an iterative decoding algorithm for the LDPC code defined in GF(q).

The LDPC code, proposed by Gallager, is defined by a parity check matrix in which major elements have a value of 0 and minor elements other than the elements having the value of 0 have a non-zero value, for example, i.e., a value of 1. For convenience, it will be assumed herein that the non-zero value is a value of 1.

For example, an (N, j, k) LDPC code is a linear block code having a codeword length N, and is defined by a sparse parity check matrix in which each column has j elements having a value of 1, each row has k elements having a value of 1, and all of the elements other than the elements having the value of 1 have a value of 0.

An LDPC code in which a weight of each column in the parity check matrix is fixed to 'j' and a weight of each row in the parity check matrix is fixed to 'k' as stated above, is called a "regular LDPC code." Herein, the "weight" refers to the number of elements having a non-zero value among the elements constituting the generating matrix and parity check matrix. Unlike the regular LDPC code, an LDPC code in which the weight of each column in the parity check matrix and the weight of each row in the parity check matrix are not fixed is called an "irregular LDPC code." It is generally known that the irregular LDPC code is superior in performance to the regular LDPC code. However, in the case of the irregular LDPC code, because the weight of each column and the weight of each row in the parity check matrix are not fixed, the weight of each column in the parity check matrix and the weight of each row in the parity check matrix must be properly adjusted in order to guarantee the excellent performance.

With reference to the diagram of FIG. 3, a description will now be made of a parity check matrix of an (8, 2, 4) LDPC code as an example of the (N, j, k) LDPC code. Referring to FIG. 3, a parity check matrix H of the (8, 2, 4) LDPC code is comprised of 8 columns and 4 rows, wherein a weight of each column is fixed to 2 and a weight of each row is fixed to 4. Because the weight of each column and the weight of each row in the parity check matrix are regular, the (8, 2, 4) LDPC code illustrated in FIG. 3 is a regular LDPC code.

The parity check matrix of the (8, 2, 4) LDPC code has been described so far with reference to FIG. 3. Next, a factor graph of the (8, 2, 4) LDPC code described in connection with FIG. 3 will be described hereinbelow with reference to the diagram of FIG. 4.

Referring to FIG. 4, a factor graph of the (8, 2, 4) LDPC code is comprised of 8 variable nodes of $x_1$ 400, $x_2$ 402, $x_3$ 404, $x_4$ 406, $x_5$ 408, $x_6$ 410, $x_7$ 412 and $x_8$ 414, and 4 check nodes 416, 418, 420 and 422. When an element having a value of 1, i.e., a non-zero value, exists at the point where an $i^{th}$ row and a $j^{th}$ column of the parity check matrix of the (8, 2, 4) LDPC code cross each other, a branch is created between a variable node $x_i$ and a $j^{th}$ check node. The variable nodes of FIG. 4 can be considered as being mapped to the (8, 2, 4) LDPC codewords c=[c1, c2, c3, c4, c5, c6, c7, c8] on a one-to-one basis. That is, it can be considered that the codeword c1 is mapped to the variable node $x_i$, the codeword c2 is mapped to the variable node $x_2$, the codeword c3 is mapped to the variable node $x_3$, the codeword c4 is mapped to the variable node $x_4$, the codeword c5 is mapped to the variable node $x_5$, the codeword c6 is mapped to the variable node $x_6$, the codeword c7 is mapped to the variable node $x_7$, and the codeword c8 is mapped to the variable node $x_8$, respectively. Therefore, the (8, 2, 4) LDPC code can be decoded by delivering messages through the variable nodes and the check nodes in the factor graph, and the codewords can be estimated based on the messages of the variable nodes.

Because the parity check matrix of the LDPC code has a very small weight as described above, it is possible to perform decoding through iterative decoding even in a block code having a relatively long size, that exhibits performance approximating a channel capacity limit of Shannon's channel coding theorem, such as a turbo code, while continuously increasing a block size of the block code. MacKay and Neal have proven that an iterative decoding process of an LDPC code using a flow transfer scheme approximates an iterative decoding process of a turbo code in performance.

In order to generate a high-performance LDPC code, the following conditions should be satisfied.

(1) Cycles in a Factor Graph of an LDPC Code Should be Considered.

The term "cycle" refers to a loop formed by the edges connecting the variable nodes to the check nodes in a factor graph of an LDPC code, and a length of the cycle is defined as the number of edges constituting the loop. A long cycle means that the number of edges connecting the variable nodes to the check nodes constituting the loop in the factor graph of the LDPC code is large. In contrast, a short cycle means that the number of edges connecting the variable nodes to the check nodes constituting the loop in the factor graph of the LDPC code is small.

As cycles in the factor graph of the LDPC code become longer, the performance efficiency of the LDPC code increases, for the following reasons. That is, when long cycles are generated in the factor graph of the LDPC code, it is possible to prevent performance degradation such as an error floor occurring when too many cycles with a short length exist in the factor graph of the LDPC code.

(2) Efficient Coding of an LDPC Code Should be Considered.

It is difficult for the LDPC code to undergo real-time coding compared with a convolutional code or a turbo code because of its high coding complexity. In order to reduce the coding complexity of the LDPC code, a Repeat Accumulate (RA) code has been proposed. However, the RA code also has a limitation in reducing the coding complexity of the LDPC code. Therefore, efficient coding of the LDPC code should be taken into consideration.

(3) Degree Distribution in a Factor Graph of an LDPC Code Should be Considered.

Generally, an irregular LDPC code is superior in performance to a regular LDPC code, because a factor graph of the irregular LDPC code has various degrees. The term "degree" refers to the number of edges connected to the variable nodes and the check nodes in the factor graph of the LDPC code. Further, the phrase "degree distribution" in a factor graph of an LDPC code refers to a ratio of the number of nodes having a particular degree to the total number of nodes. It has been proven by Richardson that an LDPC code having a particular degree distribution is superior in performance.

With reference to the schematic diagram of FIG. 5, a description will now be made of a parity check matrix of a structured LDPC code.

Before a description of FIG. 5 is given, it should be noted that the structured LDPC code is a new LDPC code for which not only efficient coding but also efficient storage and performance improvement of a parity check matrix were considered, and the structured LDPC code is an LDPC code extended by generalizing a structure of a regular LDPC code.

Referring to FIG. 5, a parity check matrix of the structured LDPC code is divided into a plurality of partial blocks, and a permutation matrix is mapped to each of the partial blocks. Herein, a matrix obtained by substituting 1 for each of the partial blocks instead of the permutation matrix is referred to as a base matrix. That is, the parity check matrix of the structured LDPC code can be considered as a matrix obtained by mapping the permutation matrix to a point where 1 is located in the base matrix. Generally, however, the matrix constituting the parity check matrix of the structured LDPC code is not restricted to the permutation matrix. In FIG. 5, 'P' represents a permutation matrix having an $N_s \times N_s$ size, and a superscript $a_{pq}$ of the permutation matrix P is either $0 \leq a_{pq} \leq N_s - 1$ or $a_{pq} = \infty$.

In addition, 'p' indicates that a corresponding permutation matrix is located in the $p^{th}$ row of the partial blocks of the parity check matrix, and 'q' indicates that a corresponding permutation matrix is located in the $q^{th}$ column of the partial blocks of the parity check matrix. That is, $P^{a_{pq}}$ represents a permutation matrix located in a partial block where the $p^{th}$ row and the $q^{th}$ column of the parity check matrix comprised of a plurality of partial blocks cross each other. That is, the 'p' and the 'q' represent the number of rows and the number of columns of partial blocks in the parity check matrix, respectively.

FIG. 6 is a diagram illustrating the permutation matrix P of FIG. 5. As illustrated in FIG. 6, the permutation matrix P is a square matrix having an $N_s \times N_s$ size, and each of $N_s$ columns constituting the permutation matrix P has a weight of 1 and each of $N_s$ rows constituting the permutation matrix P also has a weight of 1. Herein, although a size of the permutation matrix P is expressed as $N_s \times N_s$, it will be expressed as $N_s$ for convenience because the permutation matrix P is a square matrix.

In FIG. 5, a permutation matrix P with a superscript $a_{pq}=0$, i.e. a permutation matrix $P^0$, represents an identity matrix $I_{N_s \times N_s}$, and a permutation matrix P with a superscript $a_{pq}=\infty$, i.e. a permutation matrix $P^\infty$, represents a zero matrix. Herein, $I_{N_s \times N_s}$ represents an identity matrix with a size $N_s \times N_s$.

In the entire parity check matrix of the structured LDPC code illustrated in FIG. 5, because the total number of rows is $N_s \times p$ and the total number of columns is $N_s \times q$ (for $p \leq q$), when the entire parity check matrix of the structured LDPC code has a full rank, a coding rate can be expressed as Equation (1) regardless of a size of the partial blocks.

$$R = \frac{N_s \times q - N_s \times p}{N_s \times q} = \frac{q-p}{q} = 1 - \frac{p}{q} \qquad (1)$$

If $a_{pq} \neq \infty$ for all p and q, the permutation matrixes corresponding to the partial blocks are not zero matrixes, and the partial blocks constitute a regular LDPC code in which the weight value of each column and the weight value of each row in each of the permutation matrixes corresponding to the partial blocks are p and q, respectively. Herein, each of permutation matrixes corresponding to the partial blocks will be referred to as a "partial matrix."

Because (p−1) dependent rows exist in the entire parity check matrix, a coding rate is greater than the coding rate calculated by Equation (1). In the case of the structured LDPC code, if a weight position of a first row of each of the partial matrixes constituting the entire parity check matrix is determined, the weight positions of the remaining ($N_s-1$) rows can be determined. Therefore, the required size of a memory is reduced to $1/N_s$ as compared with the case where the weights are irregularly selected to store information of the entire parity check matrix.

As described above, the term "cycle" refers to a loop formed by the edges connecting the variable nodes to the check nodes in a factor graph of an LDPC code, and a length of the cycle is defined as the number of edges constituting the loop. A long cycle means that the number of edges connecting the variable nodes to the check nodes constituting the loop in the factor graph of the LDPC code is large. As cycles in the factor graph of the LDPC code become longer, the performance efficiency of the LDPC code increases.

In contrast, as cycles in the factor graph of the LDPC code become shorter, an error correction capability of the LDPC code increases because performance degradation such as an error floor occurs. That is, when there are many cycles with a short length in a factor graph of the LDPC code, information on a particular node belonging to the cycle with a short length, starting therefrom, returns after a small number of iterations. As the number of iterations increases, the information returns to the corresponding node more frequently, so that the information cannot be correctly updated, thereby causing a deterioration in an error correction capability of the LDPC code.

FIG. 7 is a diagram schematically illustrating a cycle structure of a structured LDPC code of which a parity check matrix is comprised of 4 partial matrixes.

A parity check matrix of the structured LDPC code illustrated in FIG. 7 is comprised of 4 partial blocks, a diagonal line represents a position where the elements having a value of 1 are located, and the parts other than the diagonal-lined parts represent positions where the elements having a value of 0 are located. In addition, 'P' represents the same permutation matrix as the permutation matrix described in conjunction with FIG. 6.

In order to analyze a cycle structure of the structured LDPC code illustrated in FIG. 7, an element having a value of 1 located in an $i^{th}$ row of a partial matrix $P^a$ is defined as a reference element, and an element having a value of 1 located in the $i^{th}$ row will be referred to as a "0-point." Herein, "partial matrix" will refer to a matrix corresponding to the partial block. The 0-point is located in an $(i+a)^{th}$ column of the partial matrix pa.

An element having a value of 1 in a partial matrix $P^b$, located in the same row as the 0-point, will be referred to as a "1-point." For the same reason as the 0-point, the 1-point is located in an $(i+b)^{th}$ column of the partial matrix $P^b$.

Next, an element having a value of 1 in a partial matrix $P^c$, located in the same column as the 1-point, will be referred to as a "2-point." Because the partial matrix $P^c$ is a matrix acquired by right shifting respective columns of an identity matrix I with respect to a modulo $N_s$ by c, the 2-point is located in an $(i+b-c)^{th}$ row of the partial matrix $P^c$.

In addition, an element having a value of 1 in a partial matrix $P^d$, located in the same row as the 2-point, will be referred to as a "3-point." The 3-point is located in an $(i+b-c+d)^{th}$ column of the partial matrix $P^d$.

Finally, an element having a value of 1 in the partial matrix pa, located in the same column as the 3-point, will be referred to as a "4-point." The 4-point is located in an $(i+b-c+d-a)^{th}$ row of the partial matrix $P^a$.

In the cycle structure of the LDPC code illustrated in FIG. 7, if a cycle with a length 4 exists, the 0-point and the 4-point are located in the same position. That is, a relation between the 0-point and the 4-point is defined by Equation (2):

$$i \cong i+b-c+d-a (\bmod N_s) \text{ or}$$

$$i+a \cong i+b-c+d (\bmod N_s) \quad (2)$$

Equation (2) can be rewritten as Equation (3):

$$a+c \cong b+d (\bmod N_s) \quad (3)$$

As a result, when the relationship of Equation (3) is satisfied, a cycle with a length 4 is generated. Generally, when a 0-point and a 4p-point are at first identical to each other, a relation of $i \cong i+p(b-c+d-e)(\bmod N_s)$ is given, and the following relation shown in Equation (4) is satisfied.

$$p(a-b+c-d) \cong 0 (\bmod N_s) \quad (4)$$

In other words, for given a, b, c and d, if a positive integer having a minimum value among the positive integers satisfying Equation (4) is defined as 'p', a cycle with a length of 4p becomes a cycle having a minimum length in the cycle structure of the structured LDPC code illustrated in FIG. 7.

In conclusion, as described above, for (a−b+c−d)≠0, if gcd (greatest common divisor)($N_s$, a−b+c−d)=1 is satisfied, then p=$N_s$. Therefore, a cycle with a length $4N_s$ becomes a cycle with a minimum length.

As described above, it is known that the LDPC code, together with the turbo code, has a high performance gain during high-speed data transmission and effectively corrects an error caused by noises generated in a transmission channel, contributing to an increase in reliability of data transmission.

Meanwhile, the foregoing structured parity check matrix is designed to satisfy the design conditions of the parity check matrix to guarantee excellent performance. Therefore, the LDPC code, when it is designed with the structured parity check matrix, can not only satisfy the foregoing conditions but also facilitate the coding/decoding process, increasing attention to the structured LDPC code. The use of the structured LDPC code in the multi-antenna communication system can secure not only a high data rate but also a high reliability. Research is being presently conducted to build a communication system using the structured LDPC code.

The current communication system using the structured LDPC code transmits/receives the structured LDPC code bit by bit. For example, in the multi-antenna communication system, for bit-by-bit transmission of the structured LDPC code, it is necessary to design a bit-based check matrix of the structured LDPC code in order to design a structured LDPC code that guarantees high performance.

When the structured LDPC code is used, a size of the partial blocks is varied to support a variable length. In this case, if the structured LDPC code is mapped to a plurality of antennas, different mapping methods should be considered to guarantee excellent performance for different lengths. That is, it is necessary to construct the variable-length structured LDPC code with a different matrix for each length.

To address these problems, there is a need for a transceiver capable of efficiently transmitting/receiving the structured LDPC code, compared with transmitting/receiving the structured LDPC code bit by bit. In addition, there is a need to apply the structured LDPC code to a multi-antenna system, considered as one of the next generation communication systems.

SUMMARY OF THE INVENTION

It is, therefore, an object of the present invention to provide an apparatus and method for efficiently transmitting/receiving data in a communication system using a structured LDPC code.

It is another object of the present invention to provide an apparatus and method for transmitting/receiving data with multiple antennas in a communication system using a structured LDPC code.

It is further another object of the present invention to provide an apparatus and method for efficiently transmitting/receiving data, compared with encoding/decoding a structured LDPC code bit by bit, in a communication system using the structured LDPC code.

According to one aspect of the present invention, there is provided a method for transmitting data in a communication system using a structured Low Density Parity Check (LDPC) code, which includes performing structured LDPC coding on input information data using a structured LDPC code; and parallel-converting a structured LDPC codeword generated by performing the structured LDPC coding, in units of groups having a predetermined size, and transmitting data.

According to another aspect of the present invention, there is provided a method for receiving data in a communication system using a structured Low Density Parity Check (LDPC) code, which includes receiving a plurality of parallel data streams; serial-converting the received parallel data streams in units of groups having a predetermined size; and performing structured LDPC decoding on the data which was serial-converted group by group, using a structured LDPC code.

According to further another aspect of the present invention, there is provided an apparatus for transmitting data in a communication system using a structured Low Density Parity Check (LDPC) code, which includes a structured LDPC encoder for performing structured LDPC coding on input information data using a structured LDPC code; and a group serial-to-parallel (S/P) converter for parallel-converting a structured LDPC codeword generated by performing the structured LDPC coding, in units of groups having a predetermined size, and transmitting data.

According to yet another aspect of the present invention, there is provided an apparatus for receiving data in a communication system using a structured Low Density Parity Check (LDPC) code, which includes a parallel-to-serial (P/S) converter for receiving a plurality of parallel data streams, and serial-converting the received parallel data streams in units of groups having a predetermined size; and a structured LDPC decoder for performing structured LDPC decoding on the data which was serial-converted group by group, using a structured LDPC code.

BRIEF DESCRIPTION OF THE DRAWINGS

The above and other objects, features and advantages of the present invention will become more apparent from the following detailed description when taken in conjunction with the accompanying drawings in which:

FIG. 5 is a diagram schematically illustrating a parity check matrix of a general structured LDPC code;

FIG. 6 is a diagram illustrating the permutation matrix P of FIG. 5;

DETAILED DESCRIPTION OF PREFERRED EMBODIMENTS

Preferred embodiments of the present invention will now be described in detail with reference to the annexed drawings. In the following description, a detailed description of known functions and configurations incorporated herein has been omitted for clarity and conciseness.

The present invention provides an apparatus and method for transmitting/receiving data in a communication system using a structured Low Density Parity Check (LDPC) code. To this end, the present invention encodes input information bits using a structured LDPC code, parallel-converts the coded structured LDPC codewords bit by bit according to the number of antennas, and transmits data. A receiver, receiving the data, serial-converts the data received via multiple antennas according to a group, and performs structured LDPC decoding corresponding to the structured LDPC coding on the serial-converted data, thereby recovering the data transmitted by the transmitter. In addition, for data transmission/reception, the structured LDPC code using a group interleaving scheme is applied to the multi-antenna communication system.

A description will now be made of an apparatus and method for transmitting/receiving a structured LDPC code group by group in a multi-antenna communication system, such as a Multiple Input Multiple Output (MIMO) communication system. A detailed description of the present invention will be made with reference to the communication system that transmits/receives data using an Orthogonal Frequency Division Multiplexing (OFDM) scheme. However, the present invention is not limited to the communication system that transmits/receives data using the OFDM scheme.

A relationship between a parity check matrix H of a structured LDPC code and a codeword c of the structured LDPC code is defined as Equation (5):

$$H \cdot c^T = 0 \qquad (5)$$

If the number of block columns of the structured LDPC code is denoted by n, the parity check matrix H and the structured LDPC codeword c can be expressed in the form of a group as shown in Equation (6) below.

$$H = [H_1, H_2, H_3, \ldots, H_n]$$

$$C = [c_1, c_2, c_3, \ldots, c_n] \qquad (6)$$

In the method of expressing the codewords in the form of a group, a group $c_i$ is a set of codeword bits mapped to a block column $H_i$ of the structured LDPC code, where i denotes an index having an integer value of 1 to n. Therefore, with the use of Equation (6), Equation (5) can express a group of the block columns and the structured LDPC codewords of the parity check matrix of the structured LDPC code, as shown in Equation (7) below.

$$H_1 \cdot c_1^T + H_2 \cdot c_2^T + \ldots, + H_n \cdot c_n^T = 0 \quad (7)$$

Figure 1:
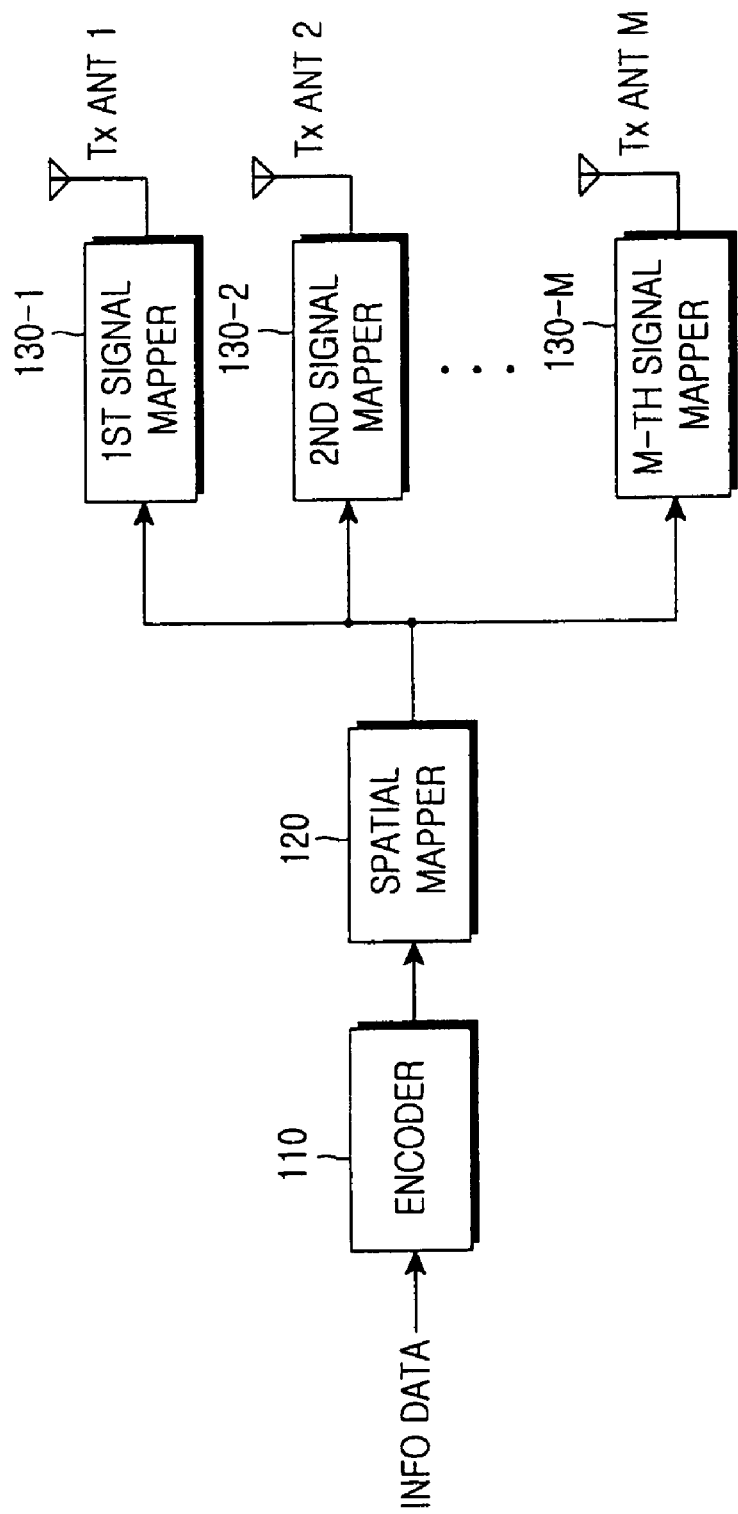
FIG. 1 is a diagram schematically illustrating a structure of a transmitter in a general MIMO communication system.
Figure 2:
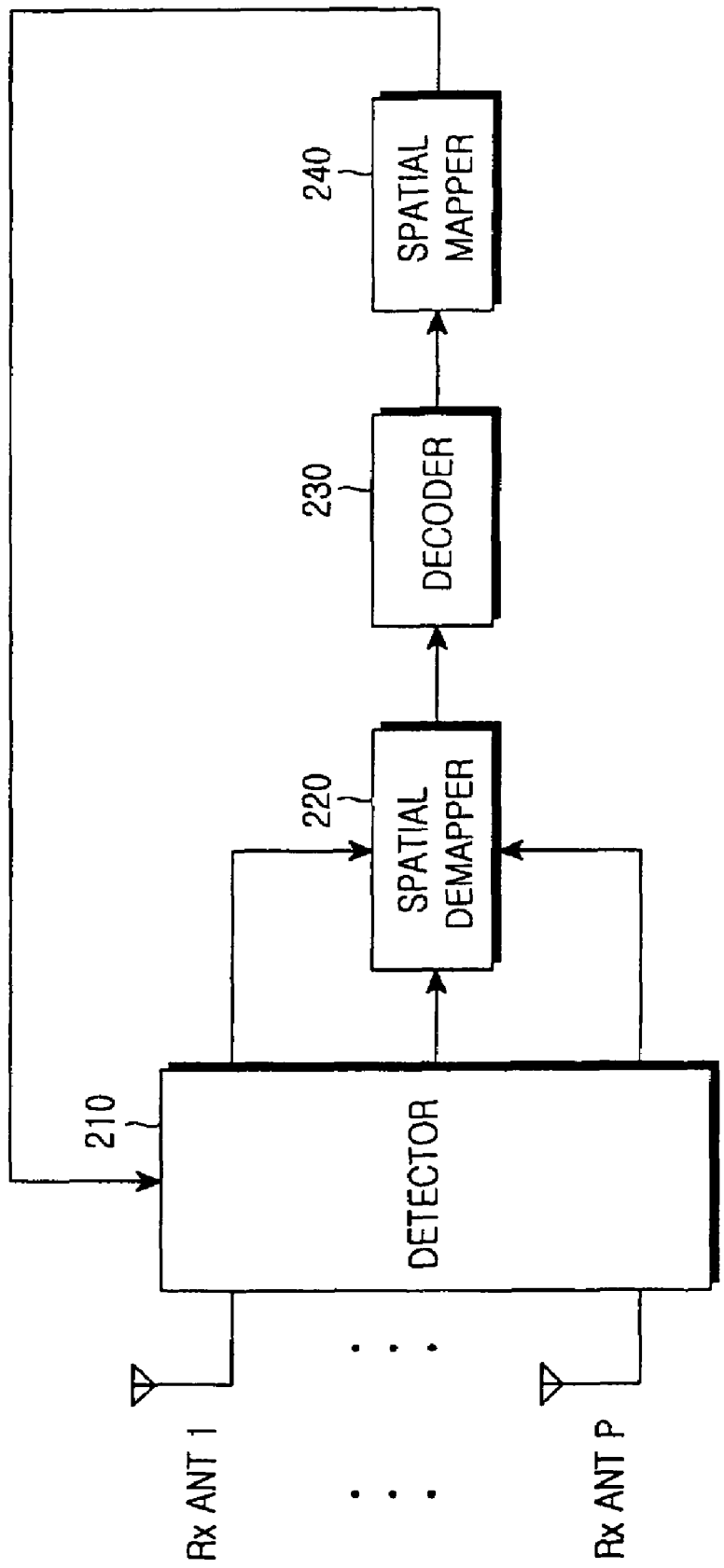
FIG. 2 is a diagram schematically illustrating a structure of a receiver in a general MIMO communication system.
Figures 3, 4:
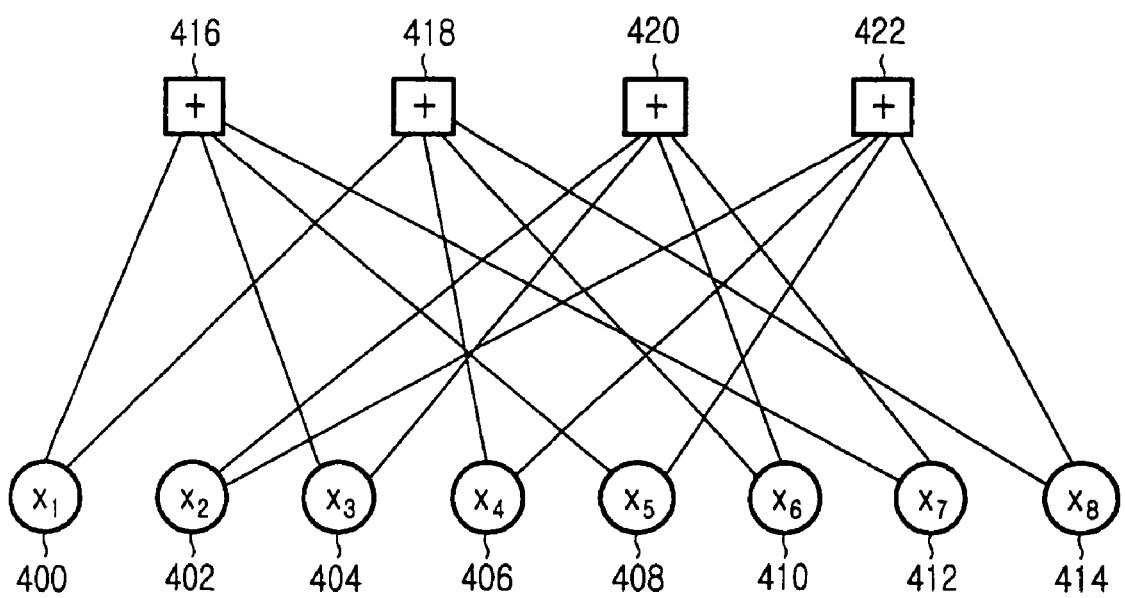
FIG. 3 is a diagram illustrating a parity check matrix of a general (8, 2, 4) LDPC code.
FIG. 4 is a diagram illustrating a factor graph of the (8, 2, 4) LDPC code of FIG. 3.
Figure 7:
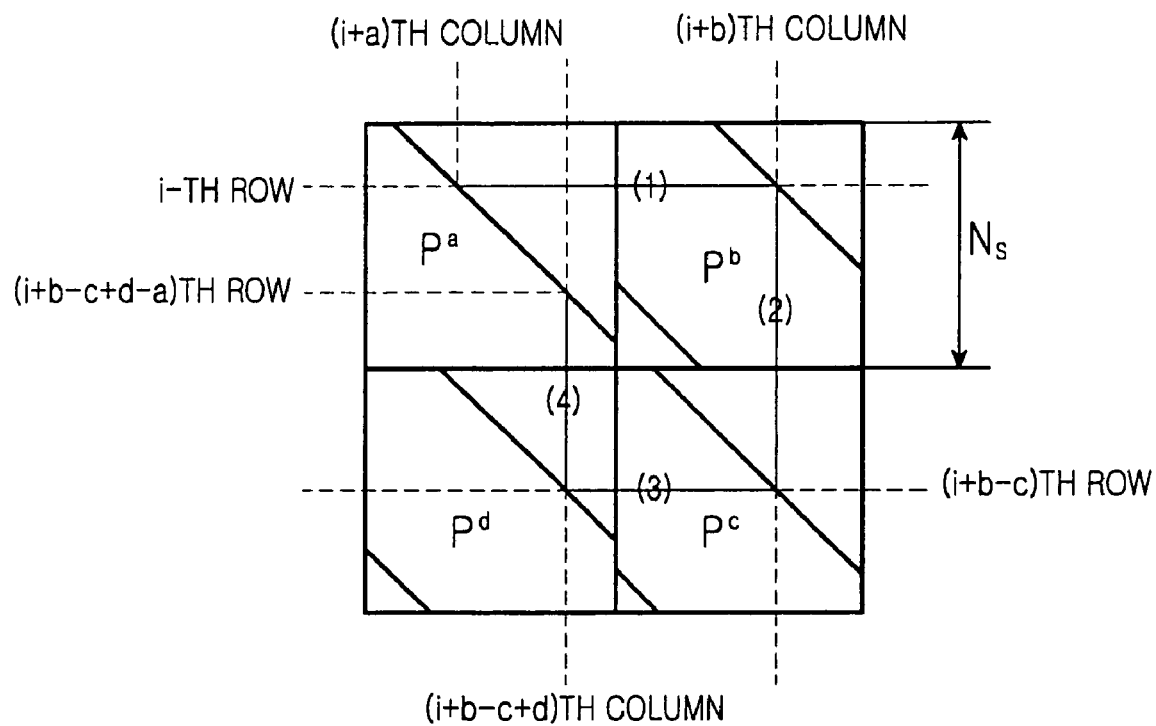
FIG. 7 is a diagram schematically illustrating a cycle structure of a structured LDPC code of which a parity check matrix is comprised of 4 partial matrixes.
Figure 8:
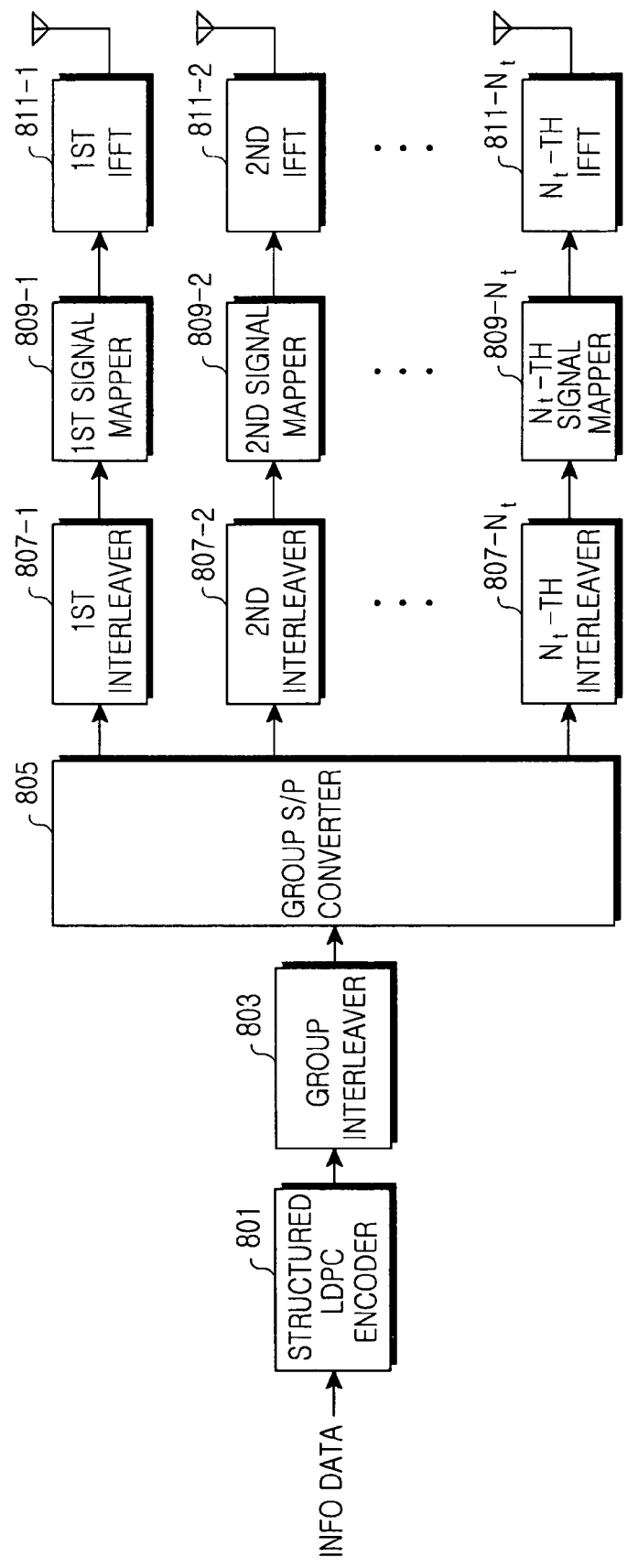
FIG. 8 is a diagram schematically illustrating a structure of a transmitter using a structured LDPC code according to a first embodiment of the present invention.

A description will now be made of a communication system that transmits the structured LDPC code composed of n block columns via a plurality of antennas. With reference to FIG. 8, a description will be made of a multi-antenna communication system that transmits/receives data group by group and uses a structured LDPC code. FIG. 8 is a diagram schematically illustrating a structure of a transmitter using a structured LDPC code according to an embodiment of the present invention.

Referring to FIG. 8, the transmitter includes a structured LDPC encoder 801, a group interleaver 803, a group serial/parallel (S/P) converter 805, an interleaving unit 807, a signal mapping unit 809, and an Inverse Fast Fourier Transform (IFFT) unit 811. The units 807, 809 and 811 each have a parallel structure.

The structured LDPC encoder 801 encodes input information data into a structured LDPC code, and outputs the result to the group interleaver 803. Herein, the structured LDPC encoder 801 encodes the input information data into a structured LDPC code having a coding rate of K/N, and outputs the coded structured LDPC code to the group interleaver 803. As to the coding rate of K/N, K denotes a length of input information bits, i.e., input information data, and N denotes a length of the code, i.e., length of the output code bits. In addition, the structured LDPC codeword c can be composed of several groups as described in connection with Equation (6).

The group interleaver 803 group-interleaves the structured LDPC codeword encoded in the structured LDPC encoder 801 group by group. For example, if the number n of column blocks of a parity check matrix of the structured LDPC code is n=8, the structured LDPC codeword c can be expressed as c=[$c_1$, $c_2$, $c_3$, $c_4$, $c_5$, $c_6$, $c_7$, $c_8$]. Herein, $c_i$ denotes an $i^{th}$ group of the codeword c, and the number of elements in the group is equal to the number of columns belonging to a block column of the structured LDPC code, and corresponds to the block column i. If a group interleaving order of the group interleaver 803 is [4, 6, 3, 8, 7, 1, 5, 2], output data c_int of the group interleaver 803 can be expressed as [c4, c6, c3, c8, c7, c1, c5, c2]. A detailed description of the group interleaver 803 will be made later. The group interleaver 803 performs group-by-group interleaving, on the structured LDPC codeword, and outputs the result to the group S/P converter 805. The group interleaver 803 is an optional element, and the structured LDPC encoder 801 may output the structured LDPC encoder to the group S/P converter 805 without passing through the group interleaver 803.

The group S/P converter 805 receives group-interleaved data output from the group interleaver 803. The group S/P converter 805 parallel-converts the group-interleaved structured LDPC codeword according to the number of antennas. The group S/P converter 805 outputs the parallel-converted structured LDPC codewords to the interleaving unit 807 which includes a plurality of interleavers. The parallel-converted data is shown in Equation (8) below, by way of example. When the group interleaver 803 is not used, the group S/P converter 805 parallel-converts the structured LDPC codewords output from the structured LDPC encoder 801 group by group, and outputs the result to the interleaving unit 807.

$$c = \begin{bmatrix} c_4 & c_7 \\ c_6 & c_1 \\ c_3 & c_5 \\ c_8 & c_2 \end{bmatrix} \quad (8)$$

Equation (8) represents output data of the group S/P converter 805, and the output data can be expressed in an $N_t \times (N/N_t)$ matrix as shown in Equation (8), where $N_t$ denotes the number of transmission antennas. In Equation (8), data in the same column is transmitted at the same time or frequency, and data in the same row is transmitted via the same antenna.

The interleaving unit 807 includes Nt interleavers of a first interleaver 807-1 to an $N_t^{th}$ interleaver 807-N$_t$, interleaves the output of the group S/P converter 805 using a predetermined interleaving scheme, and outputs the results to the signal mapping unit 809.

The signal mapping unit 809 includes $N_t$ signal mappers of a first signal mapper 809-1 and an $N_t^{th}$ signal mapper 809-N$_t$ performs signal mapping on the output data of the interleaving unit 807 using a predetermined spatial mapping scheme, and outputs the spatially-mapped signals to the IFFT unit 811.

The IFFT unit 811 includes Nt IFFT modules of a first IFFT module 811-1 to an $N_t^{th}$ IFFT module 811-N$_t$, performs IFFT on the output data of the signal mapping unit 809 to convert the data to OFDM symbols, and transmits the OFDM symbols via a plurality of transmission antennas.

A method for designing the group interleaver 803 shown in FIG. 8 will now be described below.

Design conditions of LDPC MIMO include:

1) codeword groups mapped to a low-degree column in a factor graph of a parity check matrix;

2) codeword groups mapped to a variable node belonging to a short cycle set in the factor graph of the parity check matrix;

3) codeword groups mapped to a variable mode belonging to a stopping set in the factor graph of the parity check matrix; and 4) codeword groups mapped to variable nodes connected to the same check node in the factor graph of the parity check matrix.

The codeword groups belonging to the four conditions are not transmitted via the same antenna or at the same time or frequency, if possible.

In the case of the LDPC code, when a variable node having a low reliability is connected to one check node together with a variable node having a high reliability, the variable node with the low reliability can increase its reliability by the variable node with the high reliability. In other words, if variable nodes having different reliabilities are connected to one check node, the variable node having the low reliability increases in reliability.

Therefore, the variable nodes can increase their reliabilities by the other variable nodes connected to the check node. As a result, compared with the variable nodes with the high degree, the variable nodes with the low degree can hardly increase in the reliability. Accordingly, the codeword groups mapped to the variable nodes having the low degree compared with the other variable nodes are transmitted using different antennas.

In the case of the LDPC code, variable nodes exchange information with other variable nodes connected to a check node. In this case, several variable nodes form a closed loop, and when all codeword groups mapped to the variable nodes connected to a short cycle experience a bad channel, they cannot receive much information from the other variable nodes, making it impossible to improve the reliability any more. As a result, the variable nodes connected to the short cycle should be set such that they can obtain different information, so they can deliver information from a variable node with good information to a variable node with poor information. Therefore, it is possible to improve decoding performance by transmitting codeword groups mapped to the variable nodes connected to the short cycle via different antennas.

The codeword groups mapped to variable nodes belonging not only to the short cycle but also to the stopping set are not transmitted using the same space-time-frequency. The stopping set, which is a type of a variable node set, is a set in which all elements belonging to the set and check nodes connected to the elements are connected two by two or more. Therefore, a closed loop is formed even between the variable nodes belonging to the stopping set, like the cycle. As a result, when codeword groups mapped to the variable nodes belonging to the same stopping set use the same space-time-frequency, they simultaneously pass over the bad fading channel, causing performance degradation.

In addition, variable nodes connected to the same check node are directly provided with information. Therefore, if all codeword groups mapped to the variable nodes connected to the same check node have experienced the bad fading channel, the codeword groups connected to the check node can hardly be restored.

A method for designing the interleavers is provided as follows. First, the codeword groups mapped to the variable nodes with a low degree do not use the same space-time-frequency. Second, the codeword groups mapped to the variable nodes belonging to the short cycle do not use the same space-time-frequency. Third, the codeword groups mapped to the variable nodes belonging to the stopping set do not use the same space-time-frequency. Fourth, the codeword groups mapped to the variable nodes connected to the same check node do not use the same space-time-frequency.

A description will now be made of the interleaving unit 807 having a plurality of parallel interleavers. The group S/P converter 805 outputs parallel-converted data to be transmitted via each of the plurality of antennas. The data to be transmitted via each antenna is composed of bits mapped to the high-degree variable node, bits mapped to the low-degree variable node, bits having high decoding performance, and bits having low decoding performance. The signal mapping unit 809 generates signals for transmitting the above bits via each antenna. The signals having a degree higher than that of 16-ary Quadrature Amplitude Modulation (16QAM) may differ in reliability according to bits. For example, if 4 bits constituting a 16QAM signal are denoted by b1, b2, b3 and b4, then b1 and b2 constitute a real value, and b3 and b 4 constitute an imaginary value. The b1 and b3 bits represent + or −, and the b2 and b4 bits represent amplitude of a signal-mapped bits. That is, compared with b1 and b3, b2 and b4 have lower reliability. Therefore, the bits with high decoding performance constitute b2 and b4, and the bits with low decoding performance constitute b1 and b3.

The bits transmitted in this way are mapped to antennas in units of groups having a size of permutation matrixes constituting the parity check matrix of the structured LDPC code. Because all matrixes of the structured LDPC code are mapped to the antennas group by group, only the base matrix of the parity check matrix of the structured LDPC code is designed taking into account the bits in each individual group transmitted via the plurality of antennas.

When the structured LDPC code is used, a size of the partial groups is variably changed to support the variable length. For the conventional bit-by-bit mapping, different mapping methods should be considered for different lengths, but the method of performing mapping with multiple antennas can be used to guarantee superior performance for the structured LDPC code having a variable length. That is, when the structured LDPC code with a variable length is transmitted via multiple antennas group by group, it is designed such that only the base matrix can obtain maximum gain.

The structured LDPC code can undergo group coding/decoding. That is, for coding/decoding, data input/output is performed group by group. When bit-by-bit mapping is performed during transmission via multiple antennas, there is a need for additional modules. However, when coding/decoding is performed group by group, there is no need for additional modules, and mapping to multiple antennas is easy. Therefore, the structured LDPC code is mapped to the antennas so as to obtain maximum code gain by taking into account the correlation between the bits constituting the structured LDPC code based on the parity check matrix of the structured LDPC code using the structure of the transmitter.

Figure 9:
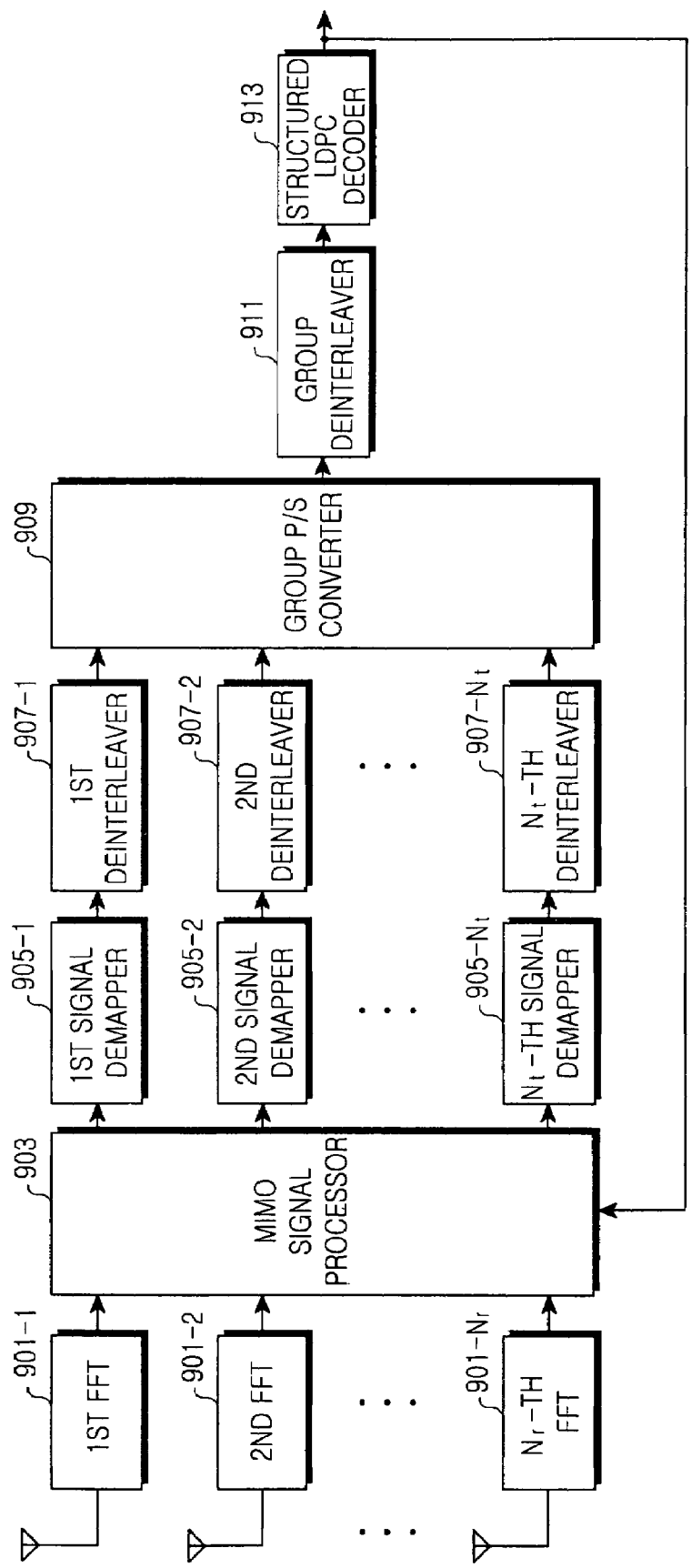
FIG. 9 is a diagram schematically illustrating a structure of a receiver using a structured LDPC code according to a second embodiment of the present invention.

FIG. 9 is a diagram schematically illustrating a structure of a receiver using a structured LDPC code according to the present invention.

Referring to FIG. 9, the receiver includes a Fast Fourier Transform (FFT) unit 901, a MIMO signal processor 903, a signal demapping unit 905, a deinterleaving unit 907, a group parallel/serial (P/S) converter 909, a group deinterleaver 911, and a structured LDPC decoder 913. The units 901, 905 and 907 have a parallel structure.

The FFT unit 901 composed of $N_r$ FFT modules including a first FFT module 901-1 to an $N_r^{th}$ FFT module 901-$N_r$, receives a plurality of OFDM symbols transmitted by the transmitter via a plurality of antennas. The FFT unit 901 performs FFT corresponding to the IFFT used in the transmitter on the received OFDM symbols according to the number of reception antennas to map the OFDM symbols to the values before the OFDM symbols, and outputs the results to the MIMO signal processor 903.

The MIMO signal processor 903 performs MIMO signal processing on the signals output from the IFFT unit 901, and outputs the signals detected by performing the MIMO signal processing to the signal demapping unit 905.

There are various possible methods for detecting the signals transmitted by the transmitter, and a detailed description thereof will be omitted herein.

The signal demapping unit 905 includes $N_t$ signal demappers of a first signal demapper 905-1 to an $N_t^{th}$ signal demapper 905-$N_t$, performs demapping corresponding to the mapping used by the signal mapping unit of the transmitter on the output data of the MIMO signal processor 903, i.e., estimates the signal-mapped bits, and outputs the results to the deinterleaving unit 907. In other words, the signal demapping unit 905 finds Log likelihood Ratio (LLR) values for the respective bits.

The deinterleaving unit 907 includes $N_t$ deinterleavers of a first deinterleaver 907-1 to an $N_t^{th}$ deinterleaver 907-$N_t$, performs deinterleaving corresponding to the interleaving used by the interleaving unit of the transmitter on the output data of the signal demapping unit 905, and outputs the deinterleaved data to the group P/S converter 909.

The group P/S converter 909 converts the deinterleaved parallel data into a serial data signal, and outputs the serial data signal to the group deinterleaver 911.

The group deinterleaver 911 performs group deinterleaving on the serial data signal, and outputs the resultant signal to the structured LDPC decoder 913. The group deinterleaver 911 is optionally used, like the group interleaver of the transmitter, according to whether the group interleaver of the transmitter is used or not. Therefore, when the transmitter performs group interleaving on the structured LDPC codewords using the group interleaver, the receiver also performs group deinterleaving using the group deinterleaver 911.

The structured LDPC decoder 913 decodes the signal encoded by the structured LDPC encoder. The decoded data can be input back to the MIMO signal processor 903 to undergo iterative decoding, making it possible to construct a reliable receiver. The structure of the receiver is constructed depending on the structure of the transmitter.

Figure 10:
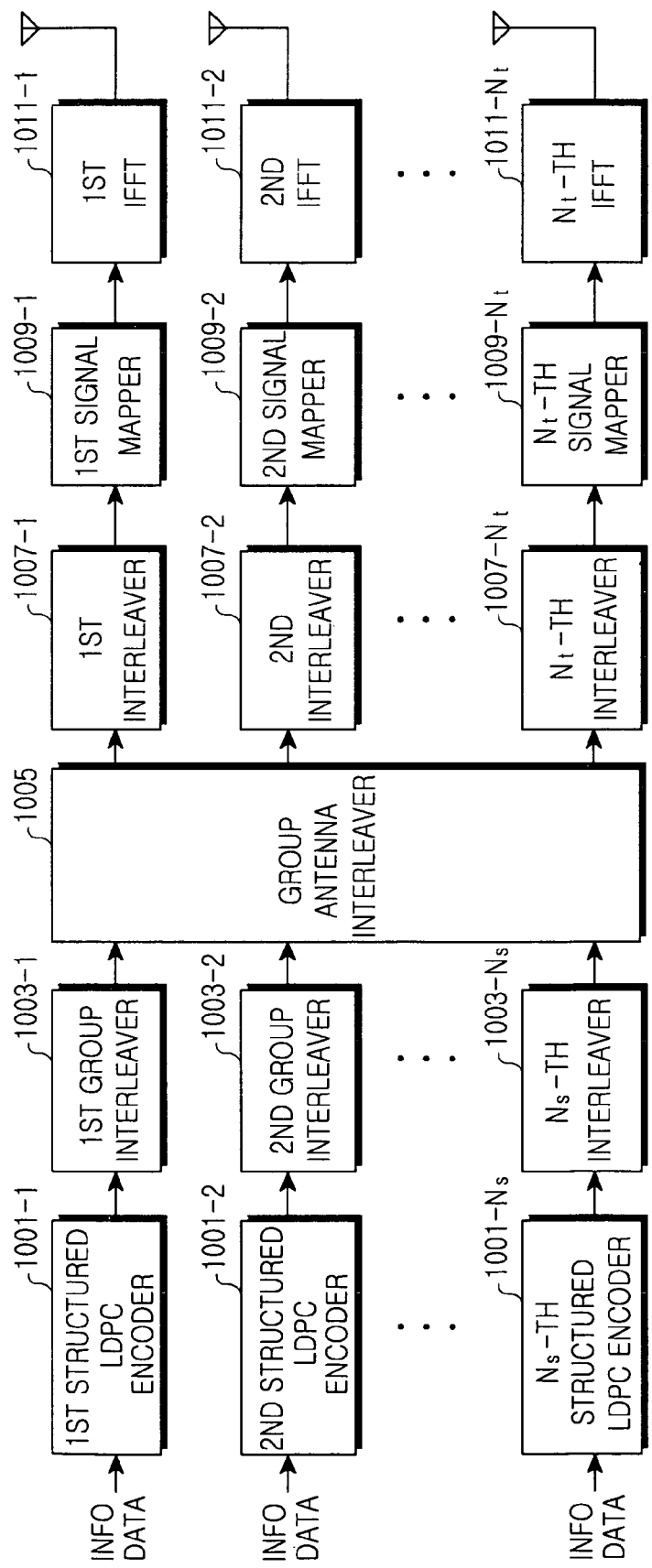
FIG. 10 is a diagram schematically illustrating a structure of a transmitter using a structured LDPC code according to a third embodiment of the present invention.
Figure 11:
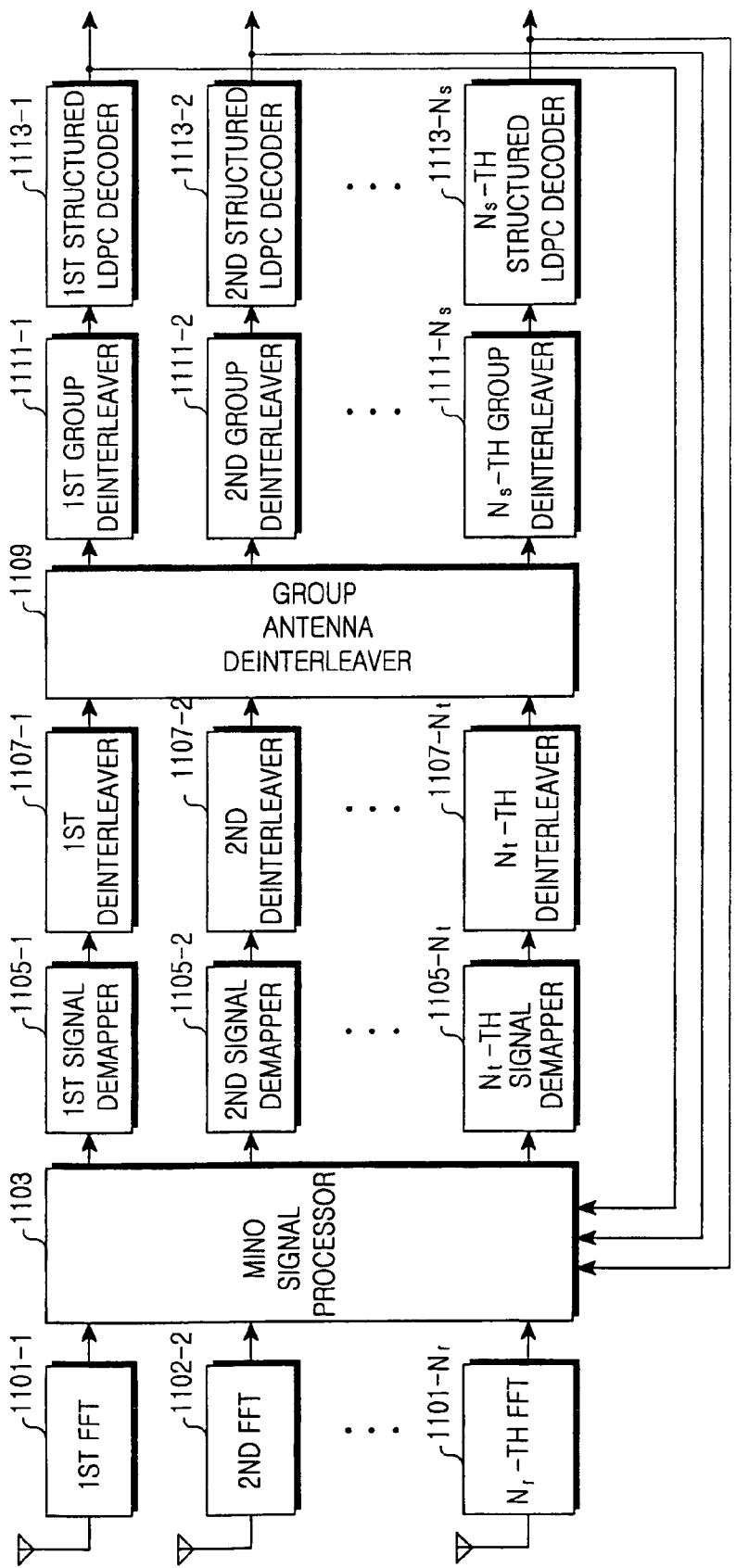
FIG. 11 is a diagram schematically illustrating a structure of a receiver using a structured LDPC code according to a fourth embodiment of the present invention.

With reference to FIGS. 10 and 11, a description will now be made of a structure of a transceiver different from the structure of the transceiver illustrated in FIGS. 8 and 9. In the description of FIGS. 10 and 11, the structures similar or the same as the structures illustrated in FIGS. 8 and 9 will not be described.

FIG. 10 is a diagram schematically illustrating a structure of a transmitter using a structured LDPC code according to another embodiment of the present invention.

Referring to FIG. 10, the transmitter includes a structured LDPC encoding unit 1001, a group interleaving unit 1003, a group antenna interleaver 1005, an interleaving unit 1007, a signal mapping unit 1009, and an IFFT unit 1011.

The structured LDPC encoding unit 1001 including $N_s$ structured LDPC encoders of a first structured LDPC encoder 1001-1 to an $N_s^{th}$ structured LDPC encoder 1001-$N_s$, performs structured LDPC coding on parallel input information data, and outputs the results to the group interleaving unit 1003.

The group interleaving unit 1003 including $N_s$ group interleavers of a first group interleaver 1003-1 to an $N_s^{th}$ group interleaver 1003-$N_s$, receives the signals output from the structured LDPC encoding unit 1001. The group interleaving unit 1003 performs group interleaving on the received signals such that they can be transmitted via a plurality of antennas according to the foregoing conditions based on the fact that the signals transmitted via the plurality of antennas have different reliabilities as described above.

Because this transmitter, unlike the transmitter of FIG. 8, performs independent structured LDPC coding, it is possible to allow the groups mapped to the variable node guaranteeing a high reliability in the independently coded bits and the groups mapped to the variable node having a low reliability to share the same time or frequency. Therefore, the coded bits are output in such a way that if the output bits of the first group interleaver 1003-1 are the bits mapped to the variable node having a high degree, the output bits of the last $N_s^{th}$ group interleaver 1003-$N_s$ are the bits mapped to the variable node having a low degree. The outputs of the group interleaving unit 1003 are input to the group antenna interleaver 1005, after undergoing group interleaving.

The group antenna interleaver 1005 performs group antenna interleaving on the outputs of the group antenna interleaving unit 1003 so as to acquire antenna diversity that each structured LDPC code can obtain when it is transmitted via a plurality of antennas. If the group antenna interleaver 1005 is not constructed, the output data of the structured LDPC encoding unit 1001 having the independent structure is transmitted via the same antenna, so the antenna diversity cannot be obtained. Therefore, with the use of the group antenna interleaver 1005, the output bits of one structured LDPC encoder are transmitted via different antennas, obtaining antenna diversity. The output data of the group antenna interleaver 1005 is input to the interleaving unit 1007.

The interleaving unit 1007 including $N_t$ interleavers of a first interleaver 1007-1 to an $N_t^{th}$ interleaver 1007-$N_t$, performs interleaving on the input data taking into account the fact that it has a different reliability according to positions of the output bits of the signal mapping unit, and outputs the interleaved data to the signal mapping unit 1009.

The signal mapping unit 1009 including $N_t$ signal mappers 1009 of a first signal mapper 1009-1 to an $N_t^{th}$ signal mapper 1009-$N_t$, performs spatial mapping on the data output from the interleaving unit 1007 according to a predetermined spatial mapping scheme, and outputs the spatially-mapped signals to the IFFT unit 1011.

The IFFT unit 1011 including $N_t$ IFFT modules of a first IFFT module 1011-1 to an $N_t^{th}$ IFFT module 1011-$N_t$, performs IFFT on the output data of the signal mapping unit 1009 to convert the output data to OFDM symbols, and transmits the OFDM symbols via a plurality of transmission antennas.

In this way, the transmitter maps the input information data to the antennas so as to obtain the maximum coding gain taking into account the correlation between the bits constituting the structured LDPC code based on the parity check matrix of the structure LDPC code.

FIG. 11 is a diagram schematically illustrating a structure of a receiver using a structured LDPC code according to another embodiment of the present invention.

Referring to FIG. 11, the receiver includes an FFT unit 1101, a MIMO signal processor 1103, a signal demapping unit 1105, a deinterleaving unit 1107, a group antenna deinterleaver 1109, a group deinterleaving unit 1111, and a structured LDPC decoding unit 1113. The units 1101, 1105, 1107, 1111 and 1113 have a parallel structure.

The FFT unit 1101 including of $N_r$ FFT modules of a first FFT module 1101-1 to an $N_r^{th}$ FFT module 1101-$N_r$, receives a plurality of OFDM symbols transmitted by the transmitted via a plurality of reception antennas. The FFT unit 1101 performs FFT corresponding to the IFFT on the received OFDM symbols according to the number of the reception antennas, and outputs the results to the MIMO signal processor 1103.

The MIMO signal processor 1103 performs MIMO signal processing on the signals output from the FFT unit 1101, and outputs the signals detected by performing the MIMO signal processing to the signal demapping unit 1105. There are various possible methods for detecting the signals transmitted by the transmitter, and a detailed description thereof will be omitted herein.

The signal demapping unit 1105 including $N_t$ signal demappers of a first signal demapper 1105-1 to an $N_t^{th}$ signal demapper 1105-$N_t$, performs signal demapping corresponding to the signal mapping of the transmitter on the output data of the MIMO signal processor 1103, i.e., estimates signal-mapped bits, and outputs the results to the deinterleaving unit 1107. In other words, the signal demapping unit 1105 finds LLR values for the respective bits.

The deinterleaving unit 1107 composed of $N_t$ deinterleavers of a first deinterleaver 1107-1 to an $N_t^{th}$ deinterleaver 1107-$N_t$, performs deinterleaving corresponding to the interleaving of the transmitter on the output data of the signal demapping unit 1105, and outputs the deinterleaved data to the group antenna deinterleaver 1109.

The group antenna deinterleaver 1109 performs group antenna deinterleaving corresponding to the group antenna interleaving on the output data of the deinterleaving unit 1107, and outputs the results to the group deinterleaving unit 1111.

The group deinterleaving unit 1111 including of $N_s$ group deinterleavers of a first group deinterleaver 1111-1 to an $N_s^{th}$ group deinterleaver 1111-$N_s$, performs group deinterleaving on the output signals of the group antenna deinterleaver 1109, and outputs the results to the structured LDPC decoding unit 1113.

The structured LDPC decoding unit 1113 including $N_s$ structured LDPC decoders of a first structured LDPC decoder 1113-1 to an $N_s^{th}$ structured LDPC decoder 1113-$N_s$, decodes the output signals of the group deinterleaving unit 1111 to restore the coded signal. The decoded data is input back to the MIMO signal processor 1103 to undergo iterative decoding, making it possible to construct a reliable receiver.

In the multi-antenna scheme used in the transmitter and the receiver according to the present invention, the number of antennas applied to the transmitter may be identical to or different from the number of antennas applied to the receiver.

A description will now be made of a data transmission/reception process of transmitting/receiving data group by group using the structured LDPC code.

Figure 12:
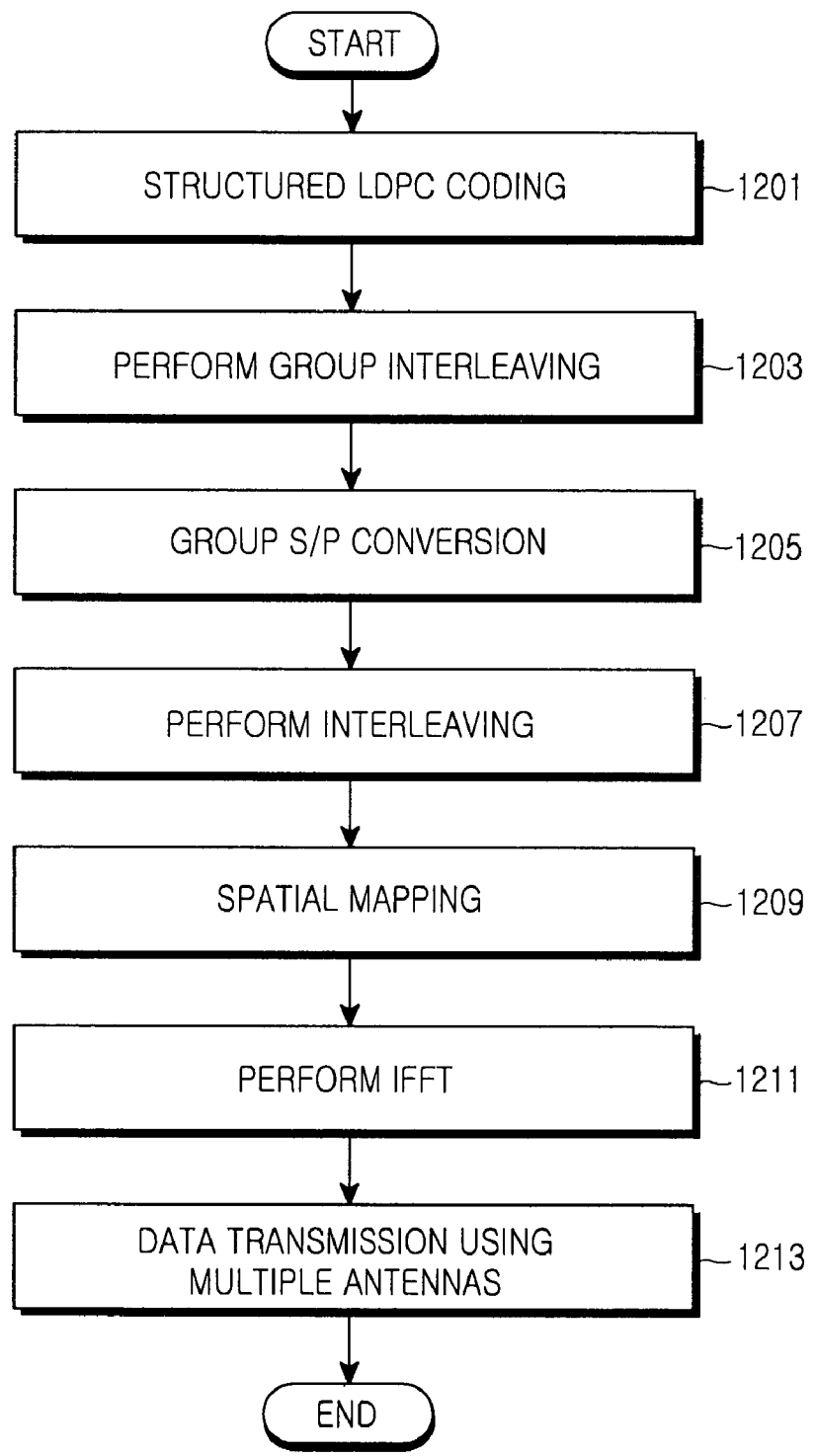
FIG. 12 is a flowchart schematically illustrating an operation process of a transmitter using a structured LDPC code according to the present invention.

FIG. 12 is a flowchart schematically illustrating an operation process of a transmitter using a structured LDPC code according to the present invention.

Referring to FIG. 12, a transmitter encodes input information data into a structured LDPC code in step 1201, and performs group interleaving on the structured LDPC code stream in step 1203. In the group interleaving process, the transmitter performs group interleaving using a group interleaving rule such that codeword groups mapped to variable nodes with a low degree, codeword groups mapped to variable nodes belonging to a short cycle, codeword groups mapped to variable nodes belonging to a stopping set, and codeword groups mapped to variable nodes connected to the same check node do not use the same space-time-frequency.

In step 1205, the transmitter parallel-converts the interleaved serial structured LDPC codeword group by group. The transmitter can generate a plurality of parallel coded bits by performing structured LDPC coding through the structured LDPC coding and the group interleaving of steps 1201 and 1203, such that bits mapped to a variable node guaranteeing a high reliability and bits mapped to a variable node with a low reliability can share the same time or frequency. In addition, when performing the structured LDPC coding and the group interleaving in parallel, the transmitter can perform group antenna interleaving without performing the group S/P conversion, thereby acquiring antenna diversity that the structured LDPC codeword can obtain in step 1205. In other words, the transmitter performs the group interleaving on the bits obtained by performing one structured LDPC coding to transmit the bits via different antennas group by group, thereby obtaining an antenna diversity gain.

In step 1207, the transmitter performs interleaving on each of the structured LDPC codewords that underwent group S/P conversion. In step 1209, the transmitter performs spatial mapping on each of the interleaved signals according to a predetermined spatial mapping scheme. In step 1211, the transmitter performs IFFT on each of the spatially-mapped signals. In step 1213, the transmitter transmits the IFFT-processed OFDM symbols via a plurality of antennas.

Figure 13:
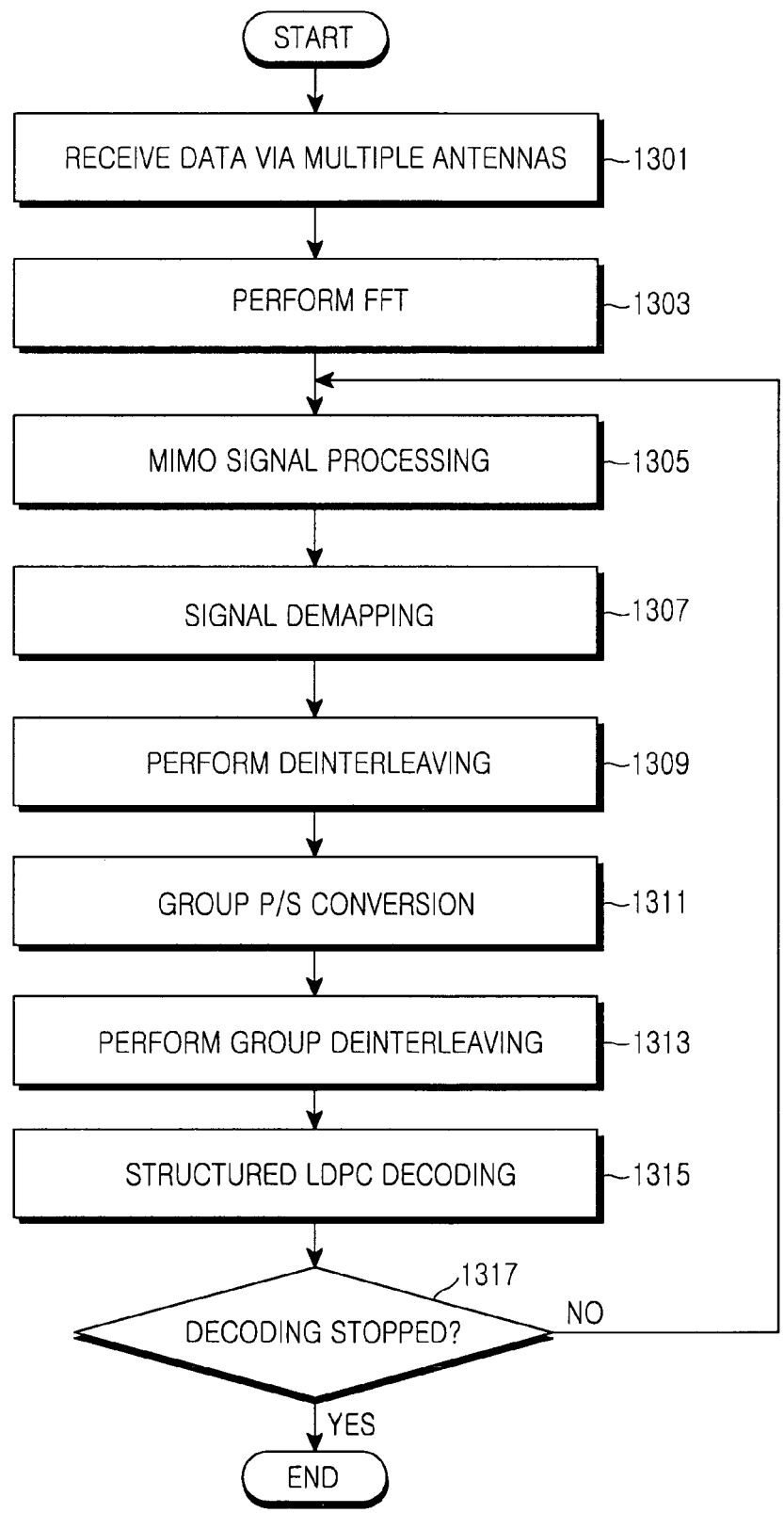
FIG. 13 is a flowchart schematically illustrating an operation process of a receiver using a structured LDPC code according to the present invention.

FIG. 13 is a flowchart schematically illustrating an operation process of a receiver using a structured LDPC code according to the present invention.

Referring to FIG. 13, a receiver receives data, i.e., OFDM symbols, transmitted by a transmitter via a plurality of antennas in step 1301, and performs FFT on the received OFDM symbols to convert the time-domain received symbols to frequency-domain received symbols in step 1303. In step 1305, the receiver performs MIMO signal processing to detect signals from the FFT-processed signals.

In step 1307, the receiver performs signal demapping corresponding to the signal mapping of the transmitter on the signals detected through the MIMO signal processing. Herein, the signal demapping is a process of estimating the bits signal-mapped in a signal mapping unit of the transmitter.

The receiver deinterleaves the demapped signals in step 1309, and performs group P/S conversion to convert parallel data into a serial data signal in step 1311. The receiver performs group deinterleaving on the serial-converted data in step 1313, and performs structured LDPC decoding on the group-deinterleaved coded data in step 1315.

The receiver determines in step 1317 whether to stop performing the structured LDPC decoding on the group-deinterleaved coded data. If the receiver determines to continuously perform the structured LDPC decoding, it returns to step 1305 to perform iterative decoding. However, if the receiver determines to stop the structured LDPC decoding, it detects the data transmitted by the transmitter, and then ends the process. As the iterative decoding is performed in step 1307, it is possible to construct a receiver having a higher reliability.

The transmitters of FIGS. 8 and 10 can optionally use the group interleaver(s). When the group interleaver is not used, the group S/P converter or the group antenna interleaver outputs in parallel the structured LDPC codewords that underwent the structured LDPC coding, group by group according to the number of antennas.

In addition, when the transmitter uses the structured LDPC encoding unit and the group interleaving unit both having a parallel structure, it can use the group antenna interleaver without using the group S/P converter. Therefore, the steps 1201 to 1205 described in connection with FIG. 12 may perform structured LDPC coding on input data in parallel, perform group interleaving on each of the coded structured LDPC codewords, and perform group antenna interleaving according to the number of antennas.

The receiver determines whether to use the group deinterleaving unit depending on whether the transmitter uses the group interleaving unit. When the receiver determines not to use the group deinterleaving unit, it allows the group P/S converter, the group antenna deinterleaver, and the structured LDPC decoding unit to perform structured LDPC decoding on the structured LDPC code stream group by group.

However, if the receiver determines to use the group deinterleaving unit without using the group P/S converter, it can use the group deinterleaving unit and the structured LDPC decoding unit both having a parallel structure. Therefore, the steps 1311 to 1315 described in connection with FIG. 13 perform group antenna deinterleaving according to the number of antennas, perform group deinterleaving on each of the signals that underwent the group antenna interleaving, and perform structured LDPC decoding on each of the group-deinterleaved signals.

In addition, the present invention can perform a coding/decoding process in units of groups having bits constituting each of permutation matrixes of the structured LDPC code, enabling fast calculation compared with bit-by-bit calculation. Further, in the case of the structured LDPC code, the size of the permutation matrixes can be adjusted to support a variable length, increasing the memory efficiency as compared with storing different matrixes to construct codes having different lengths.

Figure 14:
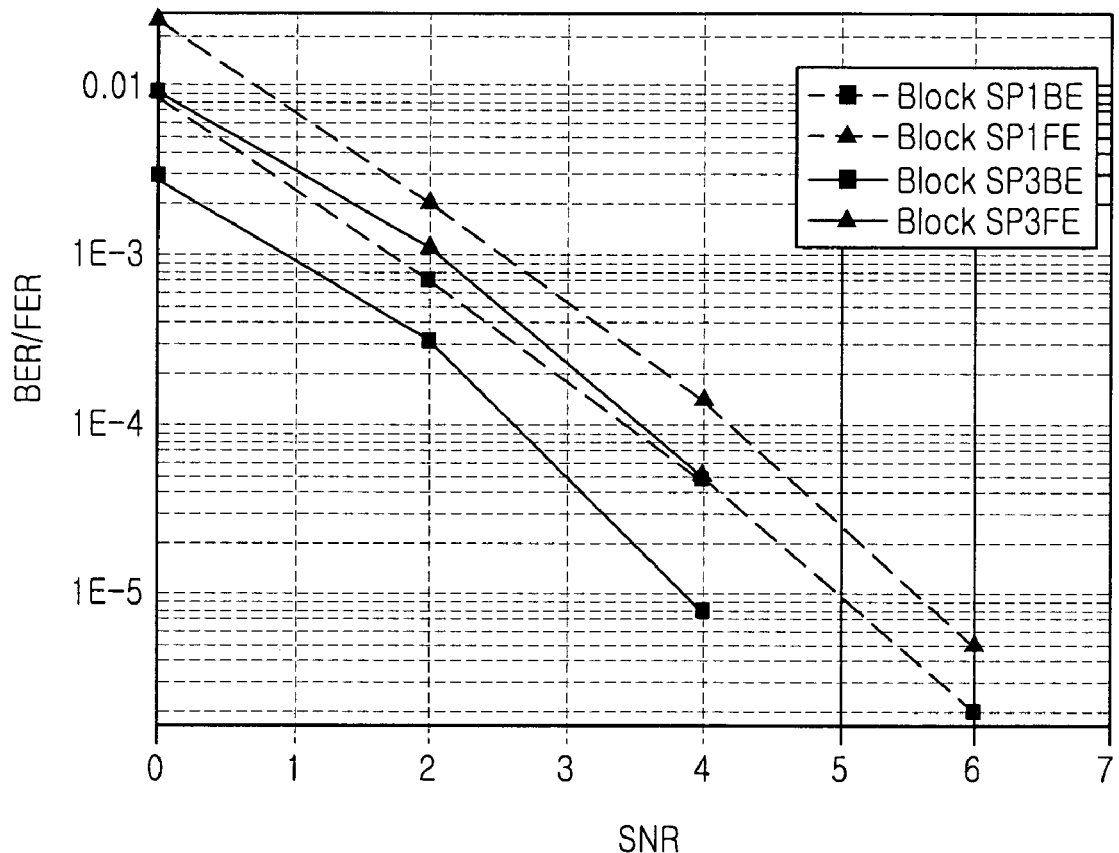
FIG. 14 is a graph illustrating performance curves in a multi-antenna system using a structured LDPC code according to the present invention.

FIG. 14 is a graph illustrating performance curves in a multi-antenna system using a structured LDPC code according to the present invention.

In FIG. 14, the structured LDPC code is applied to the multi-antenna system. As to the antennas of a transceiver, the number of transmission antennas used in the transmitter is 4 and the number of reception antennas used in the receiver is 4. The performance curves were obtained using Binary Phase Shift Keying (BPSK). The graph illustrates a Bit Error Rate (BER) and a Frame Error Rate (FER) for one case where information data is mapped to a plurality of antennas bit by bit and another case where information data is mapped to a plurality of antennas group by group.

The dotted lines in the graph represent performance curves for the case where information data is mapped to 4 transmission antennas bit by bit. The dotted line with rectangular indexes represents a BER, and the dotted line with triangular indexes represents an FER. The solid lines in the graph represent performance curves for the case where information data is mapped to 4 transmission antennas group by group. The solid line with rectangular indexes represents a BER, and the solid line with triangular indexes represents an FER. The channel used at this time is a quasi-static channel, which is static for a one-frame time. Therefore, it can be noted from FIG. 14 that for a BER of $10^{-5}$, the group mapping exhibits a higher performance gain of at least 1 dB compared with the bit mapping.

As can be understood from the foregoing description, the present invention performs group coding/decoding using a structured LDPC code, thereby increasing coding/decoding efficiency. In addition, the present invention provides a new method for mapping transmission signals to a plurality of antennas based on a parity check matrix of the structured LDPC code making the best use of the advantages of the structured LDPC code, thereby maximizing the entire system performance. Moreover, the MIMO system uses the structured LDPC code, guaranteeing superior performance with a simple hardware structure.

While the invention has been shown and described with reference to a certain preferred embodiments thereof, it will be understood by those skilled in the art that various changes in form and details may be made therein without departing from the spirit and scope of the invention as defined by the appended claims.

What is claimed is:

1. A method for transmitting data in a communication system using a structured Low Density Parity Check (LDPC) code, the method comprising the steps of:
   performing structured LDPC coding on input information data using a structured LDPC code; and
   parallel-converting a structured LDPC codeword generated by performing the structured LDPC coding, in units of groups, and transmitting data,
   wherein the parallel converting comprises parallel-converting the structured LDPC codeword according to a number of antennas.

2. The method of claim 1, wherein a size of the groups is equal to a size of a permutation matrix of the structured LDPC code.

3. The method of claim 1, further comprising performing group interleaving on the structured LDPC codeword in the units of the groups, and parallel-converting the group-interleaved structured LDPC codeword according to the number of the antennas.

4. The method of claim 3, wherein the group interleaving is performed such that when codeword bits with a low degree, codeword bits belonging to a short cycle set, and codeword bits belonging to a stopping set correspond to a condition of variable nodes connected to the same check node, structured LDPC codeword bits do not use the same space-time-frequency.

5. The method of claim 1, wherein the step of performing structured LDPC coding comprises:
   performing structured LDPC coding on each of at least two data streams received in parallel;
   performing group interleaving on each of at least two structured LDPC codewords generated by performing the structured LDPC coding, in units of groups having a predetermined size;
   performing group antenna interleaving on the group-interleaved structured LDPC codewords so as to obtain antenna diversity, and parallel-converting the structured LDPC codewords that underwent the group antenna interleaving; and
   transmitting the parallel-converted structured LDPC codewords.

6. The method of claim 1, further comprising performing interleaving on each of the structured LDPC codewords which were parallel-converted group by group, using an interleaving scheme corresponding to the number of transmission antennas, and transmitting data.

7. The method of claim 1, wherein the parallel-converting further comprises:
   mapping each of the groups of the structured LDPC codeword on one of a plurality of antennas; and
   transmitting the mapped groups in each of the units of the groups through the antennas.

8. A method for receiving data in a communication system using a structured Low Density Parity Check (LDPC) code, the method comprising the steps of:
   receiving a plurality of parallel data streams;
   serial-converting the received parallel data streams in units of groups having a predetermined size; and
   performing structured LDPC decoding on the data which was serial-converted group by group, using a structured LDPC code.

9. The method of claim 8, wherein the receiving step comprises receiving a plurality of parallel data streams using multiple antennas.

10. The method of claim 8, wherein the size of a group is equal to a size of a permutation matrix of a structured LDPC code.

11. The method of claim 8, further comprising:
    serial-converting the received parallel data streams;
    performing group deinterleaving on the serial-converted data in units of groups having a predetermined size; and
    performing structured LDPC decoding on the group-deinterleaved data.

12. The method of claim 8, further comprising detecting a signal by performing Multiple Input Multiple Output (MIMO) signal processing on the received parallel data streams, and serial-converting the detected signal in units of groups having a predetermined size.

13. The method of claim 12, wherein the signal detection step comprises detecting a signal by iterative-decoding the received signal using data that underwent the structured LDPC decoding.

14. The method of claim 12, further comprising deinterleaving the signal detected by performing the MIMO signal processing, and serial-converting the deinterleaved signal in units of groups having a predetermined size.

15. The method of claim 8, further comprising:
    performing group antenna deinterleaving corresponding to a group antenna interleaving scheme of a transmitter that transmitted the data, on the received parallel data streams;
    performing group deinterleaving on each of at least two parallel data streams that underwent the group antenna deinterleaving, in units of groups having a predetermined size; and performing structured LDPC decoding on each of the group-deinterleaved parallel data streams.

16. An apparatus for transmitting data in a communication system using a structured Low Density Parity Check (LDPC) code, the apparatus comprising:
a structured LDPC encoder for performing structured LDPC coding on input information data using a structured LDPC code; and
a group serial-to-parallel (SIP) converter for parallel-converting a structured LDPC codeword generated by performing the structured LDPC coding, in units of groups having a predetermined size, and transmitting data.

17. The apparatus of claim 16, wherein the size of a group is equal to a size of a permutation matrix of a structured LDPC code.

18. The apparatus of claim 16, further comprising a group interleaver for performing group interleaving on the structured LDPC codeword of the structured LDPC encoder in units of groups having a predetermined size.

19. The apparatus of claim 18, wherein the group S/P converter parallel-converts the structured LDPC codeword group-interleaved in the group interleaver according to the number of antennas.

20. The apparatus of claim 18, wherein the group interleaver performs group interleaving such that when codeword bits with a low degree, codeword bits belonging to a short cycle set, and codeword bits belonging to a stopping set correspond to a condition of variable nodes connected to the same check node, structured LDPC codeword bits do not use the same space-time-frequency.

21. The apparatus of claim 16, further comprising at least one interleaver for performing interleaving on the structured LDPC codewords which were parallel-converted group by group, using an interleaving scheme corresponding to the number of transmission antennas, and transmitting data.

22. The apparatus of claim 16, wherein the group S/P converter parallel-converts the structured LDPC codewords according to the number of antennas.

23. The apparatus of claim 16, further comprising multiple antennas for transmitting the data.

24. The apparatus of claim 16, wherein the structured LDPC encoder includes at least two structured LDPC encoders for performing structured LDPC coding on each of parallel input data streams.

25. The apparatus of claim 24, further comprising:
at least two group interleavers for performing group interleaving on each of the structured LDPC codewords output from the structured LDPC encoders in units of groups having a predetermined size; and
a group antenna interleaver for performing group antenna interleaving on the structured LDPC codewords group-interleaved by the group interleavers so as to acquire antenna diversity, and parallel-converting the structured LDPC codewords that underwent the group antenna interleaving.

26. The apparatus of claim 25, wherein the group antenna interleaver parallel-converts the structured LDPC codewords according to the number of antennas.

27. An apparatus for receiving data in a communication system using a structured Low Density Parity Check (LDPC) code, the apparatus comprising:
a parallel-to-serial (P/S) converter for receiving a plurality of parallel data streams, and serial-converting the received parallel data streams in units of groups having a predetermined size; and
a structured LDPC decoder for performing structured LDPC decoding on the data which was serial-converted group by group, using a structured LDPC code.

28. The apparatus of claim 27, further comprising multiple antennas for receiving the data.

29. The apparatus of claim 27, wherein the size of a group is equal to a size of a permutation matrix of a structured LDPC code.

30. The apparatus of claim 27, further comprising a group deinterleaver for performing group deinterleaving on the serial-converted data output from the P/S converter in units of groups having a predetermined size, and outputting group-deinterleaved data to the structured LDPC decoder.

31. The apparatus of claim 27, further comprising a Multiple Input Multiple Output (MIMO) signal processor for detecting a signal by performing MIMO signal processing on the received parallel data streams, and outputting the detected signal to the group P/S converter.

32. The apparatus of claim 31, wherein the MIMO signal processor performs iterative decoding from the received parallel signal using the output signal of the structured LDPC decoder.

33. The apparatus of claim 31, further comprising a deinterleaver for deinterleaving the signal detected in the MIMO signal processor, and outputting the deinterleaved signal to the group P/S converter.

34. The apparatus of claim 27, further comprising:
a group antenna deinterleaver for performing group antenna deinterleaving corresponding to a group antenna interleaving scheme of a transmitter that transmitted the data, on the received parallel data streams;
at least two group deinterleavers for performing group deinterleaving on each of the parallel data streams that underwent the group antenna deinterleaving, in units of groups having a predetermined size; and
at least two structured LDPC decoder for performing structured LDPC decoding on each of the parallel data streams that underwent the group deinterleaving in the group deinterleavers.

* * * * *